(12) United States Patent
Findikoglu et al.

(10) Patent No.: US 7,608,335 B2
(45) Date of Patent: Oct. 27, 2009

(54) NEAR SINGLE-CRYSTALLINE, HIGH-CARRIER-MOBILITY SILICON THIN FILM ON A POLYCRYSTALLINE/AMORPHOUS SUBSTRATE

(75) Inventors: Alp T. Findikoglu, Los Alamos, NM (US); Quanxi Jia, Los Alamos, NM (US); Paul N. Arendt, Los Alamos, NM (US); Vladimir Matias, Santa Fe, NM (US); Woong Choi, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 160 days.

(21) Appl. No.: 11/001,461

(22) Filed: Nov. 30, 2004

(65) Prior Publication Data

US 2006/0115964 A1 Jun. 1, 2006

(51) Int. Cl.
*B32B 9/00* (2006.01)
*B32B 9/04* (2006.01)
*B32B 13/04* (2006.01)

(52) U.S. Cl. .......................... 428/446; 428/698; 428/699; 428/701; 428/702

(58) Field of Classification Search ................. 428/701, 428/702, 930; 505/237, 238
See application file for complete search history.

(56) References Cited

U.S. PATENT DOCUMENTS

| | | | |
|---|---|---|---|
| 6,190,752 B1 * | 2/2001 | Do et al. ...................... | 428/141 |
| 6,383,989 B2 | 5/2002 | Jia et al. | |
| 6,537,689 B2 * | 3/2003 | Schoop et al. .............. | 428/701 |
| 2003/0144150 A1 * | 7/2003 | Arendt et al. ............... | 505/237 |

* cited by examiner

*Primary Examiner*—Timothy M Speer
*Assistant Examiner*—Jonathan C Langman
(74) *Attorney, Agent, or Firm*—Bruce H. Cottrell; Samuel L. Borkowsky; Holly L. Teeter

(57) ABSTRACT

A template article including a base substrate including: (i) a base material selected from the group consisting of polycrystalline substrates and amorphous substrates, and (ii) at least one layer of a differing material upon the surface of the base material; and, a buffer material layer upon the base substrate, the buffer material layer characterized by: (a) low chemical reactivity with the base substrate, (b) stability at temperatures up to at least about 800° C. under low vacuum conditions, and (c) a lattice crystal structure adapted for subsequent deposition of a semiconductor material; is provided, together with a semiconductor article including a base substrate including: (i) a base material selected from the group consisting of polycrystalline substrates and amorphous substrates, and (ii) at least one layer of a differing material upon the surface of the base material; and, a buffer material layer upon the base substrate, the buffer material layer characterized by: (a) low chemical reactivity with the base substrate, (b) stability at temperatures up to at least about 800° C. under low vacuum conditions, and (c) a lattice crystal structure adapted for subsequent deposition of a semiconductor material, and, a top-layer of semiconductor material upon the buffer material layer.

13 Claims, 5 Drawing Sheets

| semicond. film |
| :---: |
| Si, 400 nm |
| template layer |
| $\gamma$-$Al_2O_3$, 50 nm |
| homo-epi layer |
| MgO, 50 nm |
| IBAD layer |
| MgO, 10 nm |
| nucleation layer |
| $Y_2O_3$, 5 nm |
| diffusion barrier |
| a-$Al_2O_3$, 50 nm |
| metal tape |
| Hastelloy C-276 |

NEAR SINGLE-CRYSTALLINE, HIGH-CARRIER-MOBILITY SILICON THIN FILM ON A POLYCRYSTALLINE/AMORPHOUS SUBSTRATE

This invention is the result of a contract with the United States Department of Energy (Contract No. W-7405-ENG-36). The government has certain rights to this invention.

FIELD OF THE INVENTION

The present invention relates to generally to the field of materials. More particularly, the invention relates to composites, articles, and/or electronic devices (such as thin film transistors and photovoltaic devices) and sensors that include nearly single-crystalline semiconductor films, e.g., silicon films or the like, on base substrates of polycrystalline or amorphous materials with suitable buffer layers thereon.

BACKGROUND OF THE INVENTION

High performance and low cost are the two main drivers for large scale applicability of semiconductor electronics and sensors. Thus, the challange facing the semiconductor industry is to reduce production cost while maintaining or improving device performance. In many thin film semiconductor applications, including sensor and other devices, a major technical difficulty is the lack of a suitable epitaxial template for the growth of well-oriented films. Favorable device characteristics are generally better defined and more pronounced in well-oriented (i.e., nearly single-crystalline) thin films, but conventional epitaxial film-growth techniques require single crystal templates that are either expensive or of limited availability or both.

Ion-beam-assisted deposition (IBAD) texturing has been widely used in the preparation of high temperature superconducting films in coated conductors (see, e.g., Iijima et al., U.S. Pat. No. 5,650,378 and Arendt et al., U.S. Pat. No. 5,872,080). IBAD texturing can produce nearly single-crystalline films with crystallographic properties approaching those of conventional epitaxial thin films by using an off-normal ion beam to establish a preferred orientation for film growth on a non-single-crystalline (i.e., amorphous or polycrystalline) substrate. Once established, this IBAD layer serves as a biaxially-oriented template for the epitaxial growth of subsequent layers.

In photovoltaic applications, both minority carrier lifetime and majority carrier mobility are important parameters; the short circuit current is strongly dependent on minority carrier lifetime whereas fill factor and photovoltaixc yield are dominated by majority carrier mobility. However, for thin film transistor (TFT) applications, such as metal oxide semiconductor field effect transitor (MOSFET), the majority carrier mobility is the most important parameter.

Grain boundaries in polycrystalline semiconductor films can result in local lattice distortions and dangling bonds. Such structural defects and any associated impurity segregations can modify the energy band structure in the vicinity of the grain boundary, with implications for minority carrier recombination and majority carrier transport across the boundary plane. It has been shown both theoretically and experimentally that better grain alig/ment and larger grain size lead to overall enhancement of carrier mobility.

Photovoltaic energy conversion efficiency (measured under the global AM1.5 spectrum at a cell temperature of 25° C.) for solar cells that use single crystalline silicon can approach 24%, whereas solar cells based on amorphous silicon structures seldom surpass 8% efficiency. Some prior efforts have been directed to converting amorphous silicon to microcrystalline or polycrystalline silicon (See, e.g., U.S. Pat. No. 5,456,763 or U.S. Pat. No. 5,714,404). Direct deposition of a well-oriented semiconductor such as silicon would be desirable. Thus, a new materials technology that combines the functionality of non-single-crystalline substrates with the microstuctural order and associated enhanced electrical characteristics of well-oriented films (an important aspect of conventional silicon on insulator (SOI) and wafer bonding technologies) would be highly desirable.

SUMMARY OF THE INVENTION

To achieve the foregoing and other objects, and in accordance with the purposes of the present invention, as embodied and broadly described herein, the present invention provides an article including a base substrate with: (i) a base material selected from the group consisting of polycrystalline substrates and amorphous substrates, and (ii) at least one layer of a differing material upon the surface of the base material; and, a buffer material layer upon the base substrate, the buffer material layer characterized by: (a) low chemical reactivity with the base substrate, (b) stability at temperatures up to at least about 800° C. under low vacuum conditions, and (c) a lattice crystal structure adapted for subsequent deposition of a semiconductor material.

In a preferred embodiment, the article is a semiconducting article and further includes a layer of a semiconductor material upon the buffer material layer.

The present invention further provides a process of preparing a semiconductor article including depositing a buffer material layer onto a base substrate including: (i) a base material selected from the group consisting of polycrystalline substrates and amorphous substrates, and (ii) at least one layer of a differing material upon the surface of the base material, the buffer material layer characterized by: (a) low chemical reactivity with the base substrate, (b) stability at temperatures up to at least about 800° C. under low vacuum conditions, and (c) a lattice crystal structure adapted for subsequent deposition of a semiconductor material; and, depositing a layer of a biaxially oriented semiconductor material onto the buffer material layer

DETAILED DESCRIPTION

Figure 1:
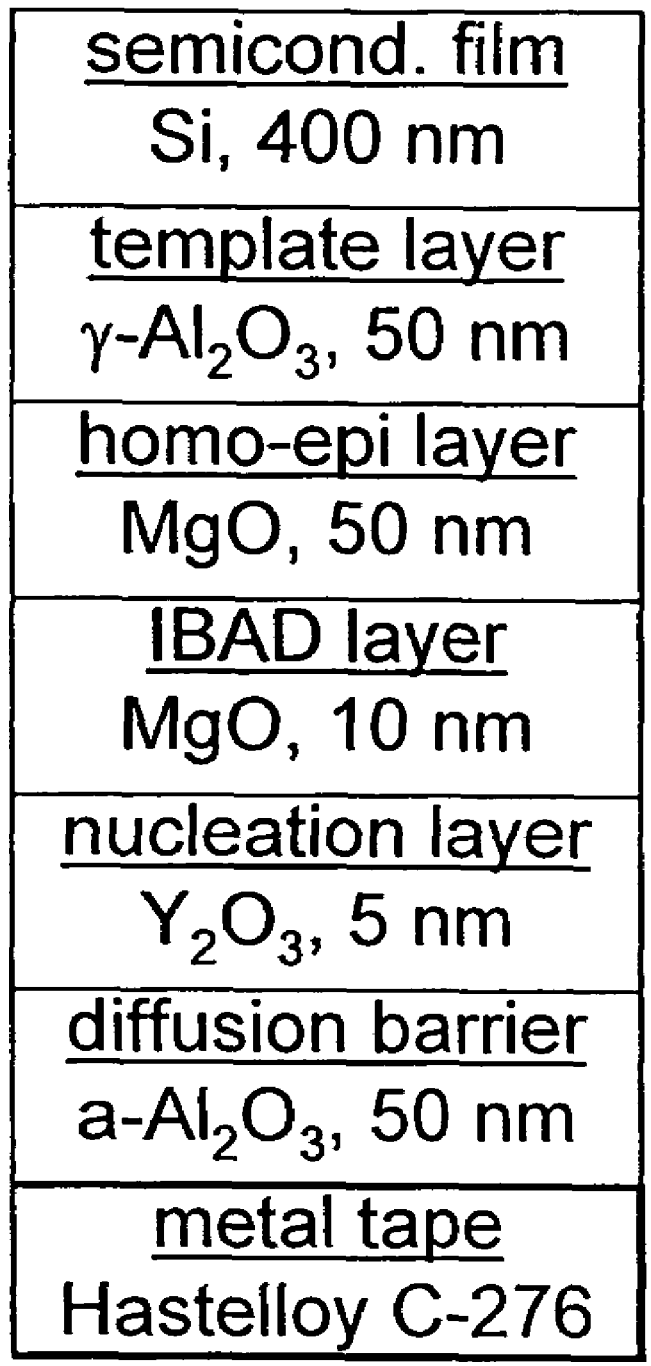
FIG. 1 shows an illustrative structure of an article in accordance with the present invention.

The present invention is concerned with deposition of near single crystalline semiconductor thin films on an underlying base substrate of a polycrystalline or amorphous material. The present invention can provide well oriented semiconductor films, e.g., silicon films or the like, on polycrystalline or amorphous base substrates.

As used herein, the terms "biaxial orientation" or "biaxially oriented" refer to a surface where the crystal grains are in close alignment in-the-plane and out-of-the-plane (i.e., perpendicular to the plane) of the surface of the substrate. One type of biaxially oriented surface is a cube textured surface, in which the crystal grains are in close alignment with directions parallel and perpendicular to the surface. The term "low vacuum conditions" refers to partial pressures of water and oxygen of less than $10^{-6}$ Torr.

In the present invention, the initial or base substrate generally includes a base material and at least one layer of a differing material upon the surface of the base material. The base materials can be, e.g., any polycrystalline material such as a metal or a ceramic such as polycrystalline aluminum oxide, polycrystalline yttria-stabilized zirconia (YSZ) or polycrystalline tantalum oxide or can be an amorphous material such as a soda-lime glass, e.g., fused silica or the like. Alloys including nickel such as various Hastelloy metals, Haynes metals and Inconel metals are also useful as the substrate. Any metal substrate on which a semiconducting material is eventually deposited should preferably allow for the resultant article to be flexible whereby semiconducting articles (e.g., Si) can be shaped. As such a metal substrate can have a rough surface, it can be mechanically polished, electrochemically polished or chemically mechanically polished to provide a smoother surface. Alternatively, the desired smoothness for subsequent depositions can be provided by a coating layer, e.g., an inert oxide material layer, to provide a smoother surface. Glass substrates such as fused silica and the like can also generally undergo electrochemical polishing or chemical mechanical polishing before any subsequent deposition.

When an as-received metal alloy starts out with an RMS roughness of less than about 15 nm, the metal substrate can be chemically mechanically polished (CMP) to a RMS roughness of about 1.5 nm. (Note: For measuring roughness, all scans are generally done using scanning force microscopy over a 5×5 μm area.) The time needed to do this is approximately 2 minutes. A suitable polishing slurry used can be commercially available colloidal silica (e.g., Mastermet 2, 0.02 μm non-crystallizing colloidal silica suspension, available from Buehler, Ltd., Lake Bluff, Ill.). If the initial metal substrate is much rougher (e.g., a RMS roughness of greater than about 15 nm), then the metal substrate is generally mechanically polished with a 1 micron diamond paste for a short time period of from about 10 seconds to about 20 seconds to get the finish to about 4 nm to about 6 nm followed by a 2 minute CMP with silica as previously described. Preferably, the metal substrate starts out with a minimum of inclusions (less than about 5 inclusions per 5×5 μm area). Inclusions are usually harder than the surrounding metal matrix and generally appear as bumps or holes (where the polishing plucks them out of the metal matrix) in surface profile scans.

The base materials can also be polished in accordance with the electropolishing process described by Kreiskott et al., in U.S. application Ser. No. 10/624,350, filed Jul. 21, 2003, for "High Current Density Electropolishing in the Preparation of Highly Smooth Substrate Tapes for Coated Conductors", such description incoprporated herein by reference. Such a process can be preferred for obtaining smoothness.

Whether the metal substrate is polished or not, at least one layer of a differing material from that of the base material can be deposited upon the surface of the base material. Among various potential layers that can be deposited upon the base material is included a layer of an inert oxide material or inert nitride material. By "inert" is meant that this oxide or nitride material does not react with the base substrate or with any subsequently deposited materials. Examples of suitable inert oxide materials include aluminum oxide ($Al_2O_3$), erbium oxide ($Er_2O_3$), yttrium oxide ($Y_2O_3$), yttria-stabilized zirconia (YSZ), tantalum oxide, tantalum nitride, molybdenum nitride, or a tantalum nitride/silicide (Ta—N—Si). Such an inert layer can be deposited on the base substrate by pulsed laser deposition, e-beam evaporation, sputtering or by any other suitable means. When the base substrate is metallic, it often has a rough surface with, e.g., a RMS of 15 nm to 100 nm or greater. Although electropolishing can provide the necessary smooth surface, adequate smoothness can also be obtained by use of suitable inert oxide layers. Generally, the inert layer has a thickness of from about 10 nanometers (nm) to about 1000 nm, more usually from about 10 nm to about 100 nm, depending upon the roughness of the base material with a thicker coating layer for rougher base material surfaces. The inert layer can serve to provide a smooth surface for subsequent depositions. By "smooth" is meant a surface having a root mean square (RMS) roughness of less than about 2 nm, preferably less than about 1 nm. To obtain the desired smoothness, it can be preferred to treat the deposited inert layer by chemical mechanical polishing. In the case of erbium oxide, the inert material can also serve as a nucleation layer for subsequent layers.

Another layer of a differing material from that of the base material which can be deposited in the present invention is a layer of an oxide or oxynitride material deposited upon any inert material layer. Such an oxide or oxynitride layer can serve as a nucleation layer for oriented growth of subsequent layers. The oxide or oxynitride layer can be deposited by pulsed laser deposition, e-beam evaporation, sputtering or by any other suitable means. The layer is generally deposited at temperatures generally from about 20° C. to about 100° C. The oxide or oxynitride layer is typically from about 5 nm to about 100 nm in thickness, preferably from about 5 nm to about 40 nm. Among the oxide or oxynitride materials suitable as the layer are included yttrium oxide ($Y_2O_3$), aluminum oxynitride (AlON), erbium oxide ($Er_2O_3$), yttria-stabilized zirconia (YSZ), cerium oxide ($CeO_2$), europium oxide, nickel aluminate ($NiAl_2O_4$), and barium zirconate ($BaZrO_3$). Preferably, the layer of oxide or oxynitride material is yttrium oxide, aluminum oxynitride, erbium oxide or yttria-stabilized zirconia and more preferably is yttrium oxide or erbium oxide. In some instances, for the very best surface finishes with a RMS roughness of less than about 1 nm, after a smooth or polished metal alloy is overcoated with any inert oxide film, a short (e.g., about 5 seconds) CMP step can be conducted.

Base substrates can also include subsequent IBAD overcoatings of an oriented cubic oxide material or cubic nitride material prepared in the following manner. Such oriented cubic materials can be, e.g., magnesium oxide, calcium oxide, strontium oxide, zirconium oxide, barium oxide, europium oxide, samarium oxide, titanium nitride and other rock salt or rock salt-like materials such as described by Do et al. (U.S. Pat. No. 6,190,752). Preferably, the layer of oriented material is a magnesium oxide (MgO) layer. Such a MgO layer is preferably deposited by electron beam evaporation with an ion beam assist. The MgO layer in the ion beam assisted deposition is typically evaporated from a crucible of magnesia. An ion-assisted, electron-beam evaporation system similar to that described by Wang et al., App. Phys. Lett., vol. 71, no. 20, pp. 2955-2957 (1997), can be used to deposit such a MgO film. Alternatively, a dual-ion-beam sputtering system similar to that described by Iijima et al., IEEE Trans. Appl. Super., vol. 3, no. 1, pp. 1510 (1993), can be used to deposit such a MgO film. Generally, the substrate normal to ion-assist beam angle is 45±3°. In some suitable embodiments, the cubic oxide can have a rock-salt-like structure.

The ion source gas in the ion beam assisted deposition can be, e.g., argon, krypton, xenon, neon, helium or a reactive gas such as oxygen or nitrogen. Preferably, the ion source gas in the ion beam assisted deposition is argon. The ion beam assisted deposition of MgO can be generally conducted with substrate temperatures of generally from about 20° C. to about 100° C. The MgO layer deposited by the IBAD process is generally from about 5 nm to about 20 nm in thickness, preferably about 8 nm to about 15 nm. After deposition of the oriented cubic oxide material, e.g., MgO, an additional thin homo-epitaxial layer of the MgO can be optionally deposited by a process such as electron beam (e-beam) deposition or magnetron sputter deposition. This thin layer can generally be about 100 nm in thickness. Deposition of this additional epitaxial layer by such a process can be more readily accomplished than depositing the entire thickness by ion beam assisted deposition.

In the present invention, a buffer layer is deposited onto the base substrate including the at least one layer of a differing material. Generally, the at least one layer of a differing material will include a toplayer of MgO. The buffer layer of the present invention will then be between the MgO layer (deposited preferably by the IBAD process for orientation) and the semiconductor layer. The buffer layer between the MgO layer and the semiconductor serves an important function in assisting lattice matching. This is sometimes referred to as "structural compatibility" meaning that the buffer layer has a substantially similar lattice crystal structure with the semiconductor material and the top layer of the base substrate. Another property of the buffer layer includes good "structural stability" under temperatures of at least 800° C. under low vacuum conditions (i.e., at partial pressures of water and oxygen of less than $10^{-6}$ Torr), conditions whereat semiconductor materials can be deposited and whereat some metal oxides can lose oxygen thereby leading to loss of structural stability. Still another property of the buffer layer includes "chemical compatibility" with adjacent layers such as the base material, any additional layers or a subsequently deposited semiconductor layer. By "chemical compatibility" is meant that the buffer layer does not undergo property-degrading chemical interactions with the adjacent layers. Among the materials suitable as the buffer layer is gamma (γ)-aluminum oxide. Other materials with similar properties may be used as well. The layer of a buffer layer such as γ-aluminum oxide is generally from about 10 nm to about 1000 nm in thickness, preferably from about 20 nm to about 200 nm in thickness.

The buffer layer is generally deposited at temperatures of greater than about 700° C., preferably at temperatures of from about 700° C. to about 950° C.

A semiconductor layer, can be deposited, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, liquid phase epitaxy and the like. The semiconductor layer can be silicon, germanium, silicon-germanium (SiGe), copper-indium-selenium (CuInSe), gallium-arsenic (GaAs), gallium-nitrogen (GaN), cadmium-tellurium (CdTe), cadmium-selenium (CdSe), copper-indium-sulfur (CuInS), and cadmium-sulfur (CdS). Other semiconductors well known to those skilled in the art may be used as well. Deposition of the semiconductor layer is generally conducted under low vacuum conditions so as to minimize formation of oxides in said a non-oxide semiconductor layer.

In pulsed laser deposition of oxide layers, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of about 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The substrate can be mounted upon a heated holder rotated at about 0.5 rpm to minimize thickness variations in the resultant film or coating, The substrate can be heated during deposition at temperatures from about 600° C. to about 950° C., preferably from about 700° C. to about 850° C. During the deposition of oxide materials, an oxygen atmosphere of from about 0.1 millitorr (mTorr) to about 500 mTorr, preferably from about 100 mTorr to about 250 mTorr, can be maintained within the deposition chamber during the deposition. Distance between the substrate and the pellet can be from about 4 centimeters (cm) to about 10 cm.

The deposition rate of the film can be varied from about 0.1 angstrom per second (Å/s) to about 200 Å/s by changing the laser repetition rate from about 0.1 hertz (Hz) to about 200 Hz. Generally, the laser beam can have dimensions of about 3 millimeters (mm) by 4 mm with an average energy density of from about 1 to 4 joules per square centimeter ($J/cm^2$). After deposition of oxide materials, the films generally are cooled within an oxygen atmosphere of greater than about 100 Torr to room temperature.

In one embodiment of the present invention illustrated in FIG. 1, a nickel alloy tape 10 is initially coated with a layer of amorphous aluminum oxide 12 from about 10 nm to 100 nm in thickness deposited by e-beam evaporation. Then, a layer 14 of $Y_2O_3$ of from about 5 nm to about 100 nm in thickness is deposited on the aluminum oxide by e-beam evaporation. Then, a layer 16 of MgO (about 10 nm) is deposited on the yttrium oxide by ion beam assisted deposition. Then, a homoepitaxial layer 18 of MgO is deposited upon the IBAD-MgO layer, the homoepitaxial layer of MgO of about 100 nm in thickness deposited in a process such as electron beam or magnetron sputter deposition. Then, a buffer layer of gamma (γ)-aluminum oxide 20 is deposited onto the MgO layer as a template for subsequent semiconductor deposition. Finally, layer 22 of silicon of from about 50 nm to about 1000 nm in thickness is deposited on the MgO layer.

The present invention is more particularly described in the following examples which are intended as illustrative only, since numerous modifications and variations will be apparent to those skilled in the art.

EXAMPLE 1

A structure in accordance with FIG. 1 was prepared as follows. A 1-cm-wide and 100-μm-thick nickel metal tape (Hastelloy C-276) was rolled and electrochemically polished to a root mean square (rms) surface roughness of about 1 nm, measured on a 5×5 $μm^2$ scale.

This flexible polycrystalline metal substrate was then cleaned by an argon ion beam etch (90 mA, 750 V, 22×6-cm rf Kaufmann source). Next, a 50 nanometer (nm) thick amorphous layer of aluminum oxide ($Al_2O_3$) was deposited at room temperature by e-beam evaporation onto the nickel metal tape. Then, a 7 nm thick layer of yttrium oxide ($Y_2O_3$) was deposited at room temperature at a rate of about 0.15 nm per second (nm/s) by e-beam evaporation. Next, a 10 nm thick layer of magnesium oxide (MgO) was deposited using ion beam assisted deposition at room temperature (argon ion assist beam at 45° to substrate normal, 90 mA, 750 V) with a deposition rate of about 0.4 nm/s. A homo-epitaxial layer of MgO (from about 50 to 100 nm) was then deposited using e-beam evaporation at about 500° C. under $5\times10^{-5}$ Torr of oxygen. A reflection high energy electron diffraction (RHEED) pattern on the MgO surface showed that the growth corresponded to c-axis growth with an in-plane lattice constant of 0.42 nm.

Next, the cubic form of $Al_2O_3$, namely $\gamma$-$Al_2O_3$, was deposited hetero-epitaxially on the top MgO layer at about 780° C. using e-beam evaporation under $5\times10^{-5}$ Torr of oxygen to form the buffer or template layer. The RHEED pattern on the surface of the 50-nm-thick $\gamma$-$Al_2O_3$ layer, indicated (001) growth, with an in-plane lattice constant of 0.79 nm.

EXAMPLE 2

A biaxially-oriented silicon (Si) film was then grown on the $\gamma$-$Al_2O_3$ buffer/template layer at a temperature of about 780° C. in an ambient chamber pressure of $1\times10^{-6}$ Torr. The doping concentration in the p-Si film was between $10^{16}$ and $10^{17}$/$cm^3$ and could be varied depending on the added amount of boron in the evaporation source of nominally pure Si. The RHEED patterns indicated that the Si grew with (001) orientation perpendicular to the substrate with in-plane lattice constant of 0.54 nm.

Figure 2:
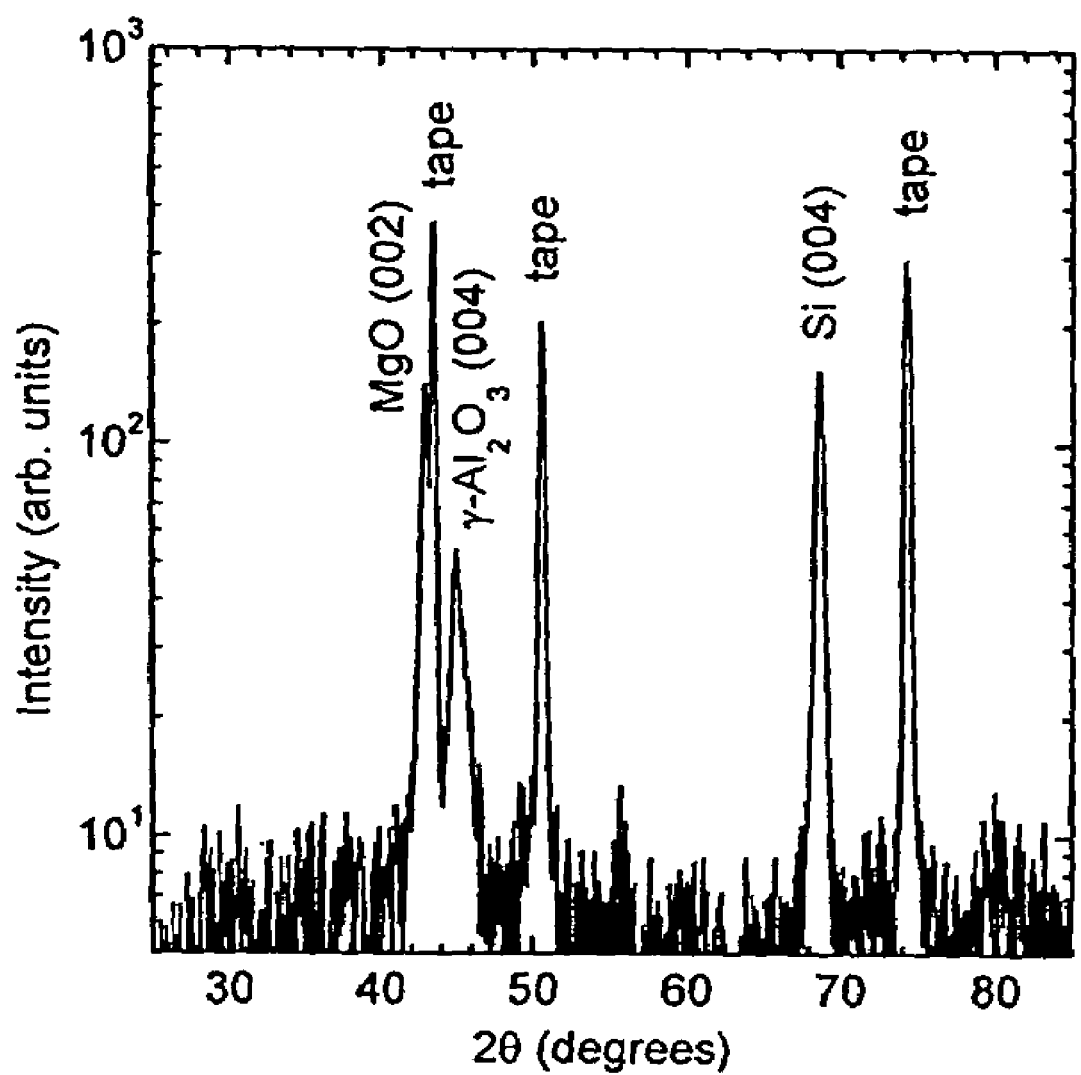
FIG. 2 shows an x-ray diffraction (XRD) θ-2θ scan of a multilayer structure in accordance with the present invention.
Figure 3:
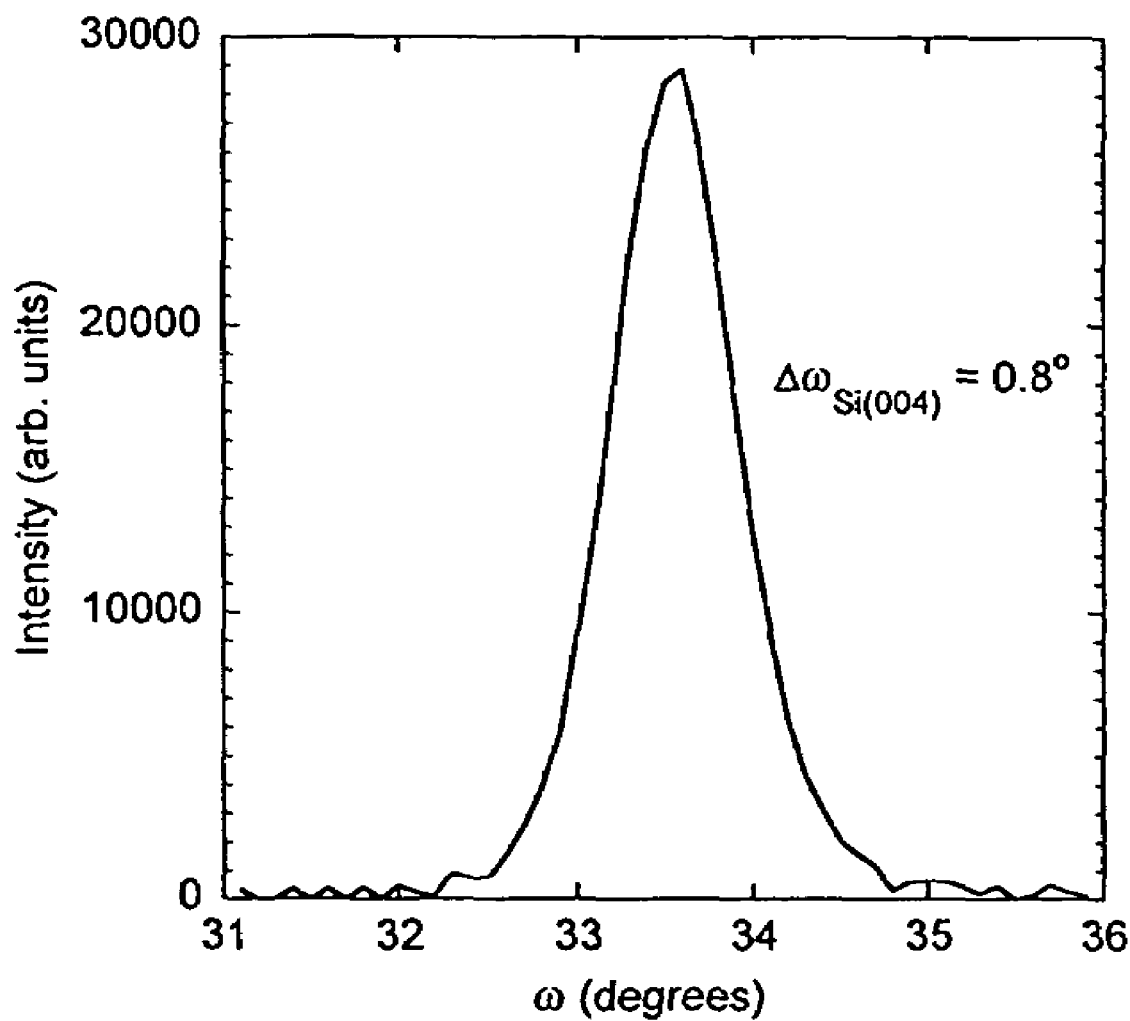
FIG. 3 shows the ω rocking curve scan on the Si (004) peak in a structure in accordance with the present invention.
Figure 4:
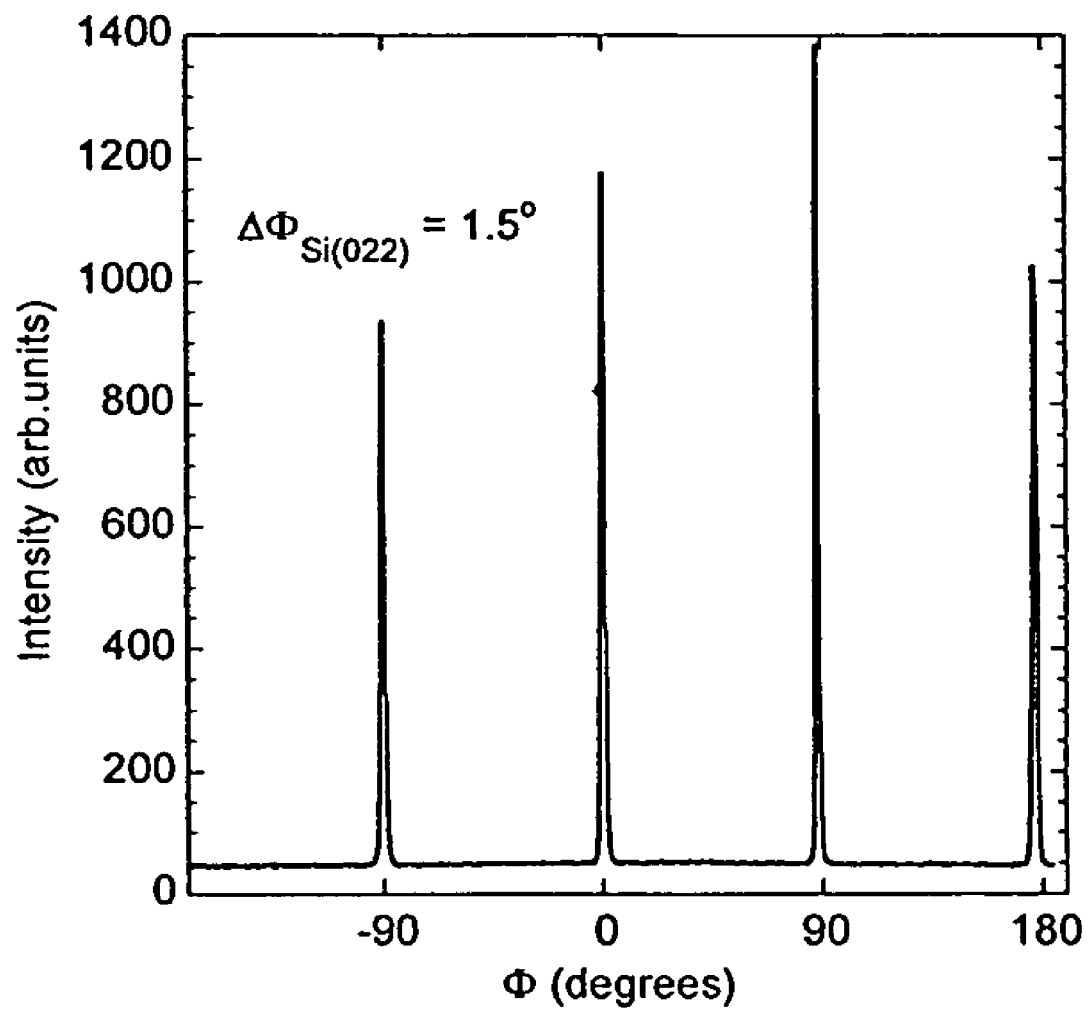
FIG. 4 shows a φ-scan of the silicon layer of a multilayer structure in accordance with the present invention.

The crystallographic orientation, epitaxial relationship, and microstructure of the multilayered samples were further analyzed by x-ray diffraction (XRD) and transmission electron microscopy (TEM). An XRD $\theta$-$2\theta$ scan (shown in FIG. 2) shows all biaxially-oriented layers (MgO, $\gamma$-$Al_2O_3$, and Si) grew with the (001) orientation perpendicular to the substrate surface. The rocking curve on the Si (004) peak yielded full width at half-maximum (FWHM) value $\Delta\omega$ of about 0.8° (FIG. 3), whereas the $\phi$-scan on the Si (022) peak showed pure four-fold symmetry, with average FWHM value $\Delta\phi$ of about 1.5° (FIG. 4). From these two values, values of of 0.8° and 1.3°, respectively, were deduced for the Si film out-of-plane ($\Delta\omega_{Si(004)}$) and in-plane ($\Delta\phi_{Si(400)}$) mosaic spreads. Similar $\phi$-scans on the MgO and $\gamma$-$Al_2O_3$ layers also show four-fold symmetry, with the epitaxial relationship being MgO (100) ||$\gamma$-$Al_2O_3$ (100)||Si (100).

Figure 5:
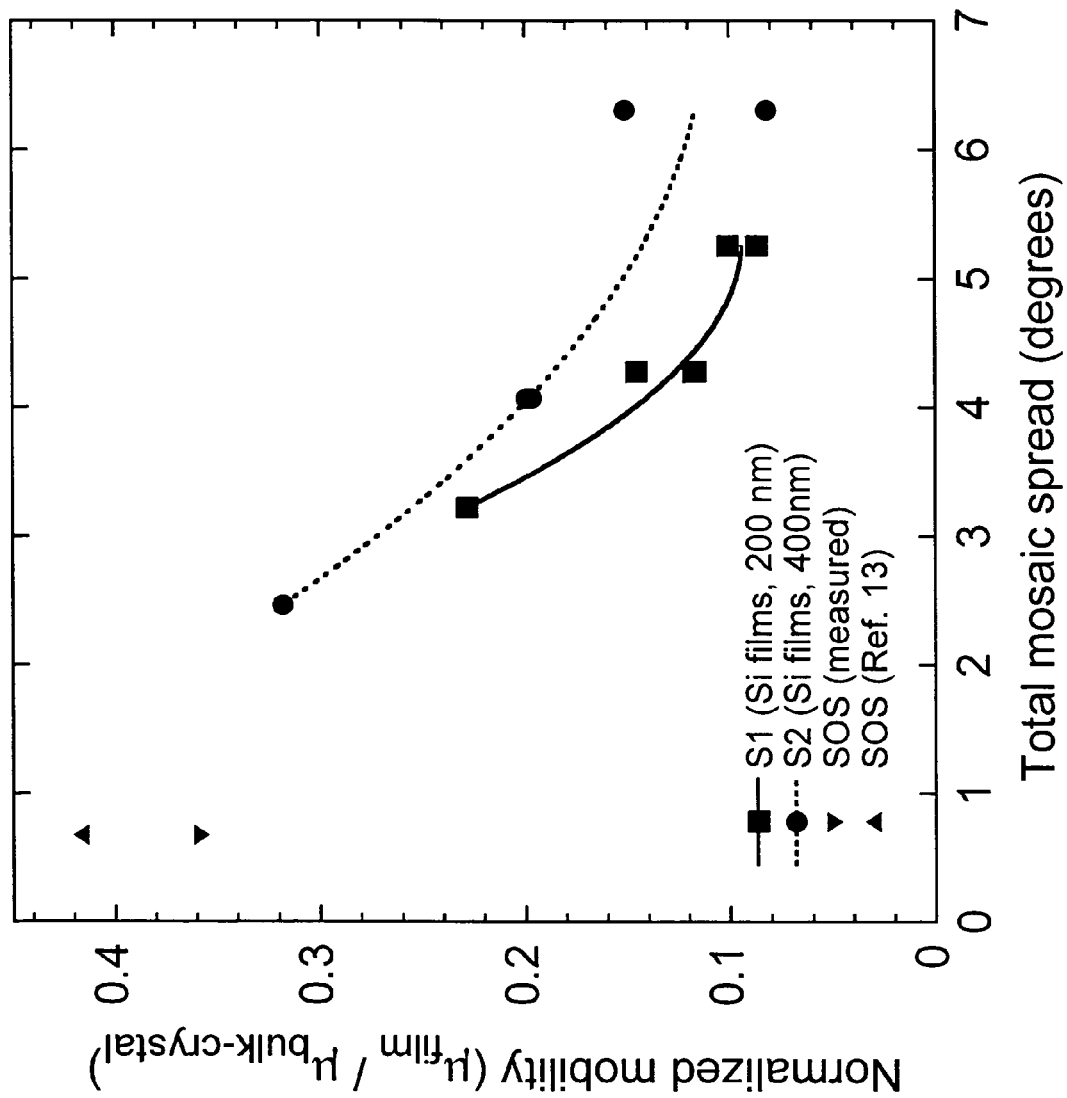
FIG. 5 shows a plot of normalized mobility versus total mosaic spread for two silicon film sets, and two silicon-on-sapphire (SOS) samples.

To study the effects of inter-grain alignment on the majority carrier transport across the film, a series of samples with varying mosaic spreads were prepared, and photolithographically patterned for Hall measurements. The Hall patterns were bridge-type, with channel widths of 400 μm, and channel lengths of between 0.4 and 1.2 mm. The contact electrodes were made with sputtered Al, followed by forming gas (94% Ar, 6% $H_2$) anneal at 350° C. for 30 mins. For comparison purposes, a lightly-doped 400-nm-thick (001)-oriented SOS film was obtained from a commercial vendor (Applied Technologies Enterprises, Inc.), and measured Hall properties on this sample following the same processing procedure. Room-temperature Hall mobility of about 89 $cm^2$ V.s was measured for the p-Si with a doping concentration of about $4.4\times10^{16}$/$cm^3$ for optimized samples, whereas the commercial p-type SOS sample yielded 135 $cm^2$ V.s at a doping concentration of $8.1\times10^{13}$/$cm^3$. FIG. 5 shows normalized mobility vs total mosaic spread for two sample sets and the processed SOS sample, together with a good quality SOS sample whose mobility was published in the literature.

From the present results, the flexibility of non-single-crystalline substrates has been combined with the microstructural order and associated enhanced electrical characteristics of well-oriented films, such films being nearly single-crystalline or single crystal-like (an important aspect of conventional SOI and wafer bonding technologies). Although the applicability of thin film technology for Si, the most widely used material in semiconductor industry, has been demonstrated on an oxide template layer, the approach could easily be extended to other material systems with the basic building blocks being a substrate with a smooth surface, an appropriate diffusion barrier layer, a biaxially-oriented intermediate IBAD stack, an appropriate template/buffer layer, and a well-oriented final film (or films) of interest.

Although the present invention has been described with reference to specific details, it is not intended that such details should be regarded as limitations upon the scope of the invention, except as and to the extent that they are included in the accompanying claims.

What is claimed is:

1. An article comprising:
   a base substrate including: (i) a base material selected from the group consisting of polycrystalline materials and amorphous materials, and (ii) at least one layer of a differing material upon the base material wherein the at least one layer of a differing material includes (a) an inert material layer upon the base material and (b) a layer selected from the group consisting of an oxide material or an oxynitride material upon the inert material layer; and,
   a gamma-aluminum oxide buffer material layer upon the base substrate; and,
   a layer of biaxially-oriented silicon upon the gamma-aluminum oxide buffer material layer.

2. The article of claim 1 wherein the base material is a polycrystalline metal.

3. The article of claim 2 wherein the at least one layer of a differing material further includes an oriented material layer deposited by ion beam assisted deposition onto the layer of an oxide material or an oxynitride material.

4. The article of claim 3 further including a layer of epitaxial oriented material between the oriented material layer and the gamma-aluminum oxide buffer material layer.

5. The article of claim 3 wherein the oriented material layer is selected from the group consisting of magnesium oxide, yttrium-stabilized zirconia, gadolinium zirconium oxide, and titanium nitride.

6. The article of claim 5 wherein the oriented material layer has a rock salt or rock-salt-like structure.

7. The article of claim 3 wherein the oriented material layer is magnesium oxide.

8. The article of claim 7 wherein the oriented material layer has a rock salt or rock-salt-like structure.

9. The article of claim 3 wherein the oriented material layer has a rock salt or rock-salt-like structure.

10. article of claim 2 wherein the inert material layer is selected from the group consisting of aluminum oxide, erbium oxide, and yttrium oxide.

11. The article of claim 2 wherein the layer of an oxide material or an oxynitride material is selected from the group consisting of yttrium oxide, erbium oxide, yttria-stabilized zirconia, cerium oxide, europium oxide and aluminum oxynitride.

12. The article of claim 1 wherein the base material is selected from the group consisting of a flexible polycrystalline metal and a glass.

13. The article of claim 1 wherein the layer of semiconductor material is characterized as having a biaxial orientation.

* * * * *